United States Patent
Ngo et al.

(10) Patent No.: US 9,945,892 B2
(45) Date of Patent: Apr. 17, 2018

(54) WIRE PROCESSING MACHINE INCLUDING A CONDUCTOR MONITOR DEVICE

(71) Applicant: OES, Inc., London (CA)

(72) Inventors: Kiet Ngo, London (CA); Michael Reeve, London (CA)

(73) Assignee: OES, INC., London, Ontario (CA)

( * ) Notice: Subject to any disclaimer, the term of this patent is extended or adjusted under 35 U.S.C. 154(b) by 347 days.

(21) Appl. No.: 14/593,001

(22) Filed: Jan. 9, 2015

(65) Prior Publication Data

US 2015/0185269 A1 Jul. 2, 2015

Related U.S. Application Data (63) Continuation-in-part of application No. 13/969,758, filed on Aug. 19, 2013.

(51) Int. Cl.
*G01R 31/02* (2006.01)
*H02G 1/12* (2006.01)

(52) U.S. Cl.
CPC ......... *G01R 31/021* (2013.01); *G01R 31/022* (2013.01); *H02G 1/1256* (2013.01); *Y10T 29/53087* (2015.01); *Y10T 29/53274* (2015.01)

(58) Field of Classification Search
CPC ........ H01R 43/28; H02G 1/12; H02G 1/1256; G01R 31/021; G01R 31/022; Y10T 29/53087; Y10T 29/53274
See application file for complete search history.

(56) References Cited

U.S. PATENT DOCUMENTS

| | | |
|---|---|---|
| 3,798,541 A | 3/1974 | Campbell et al. |
| 4,348,639 A | 9/1982 | Karbowski |
| 5,146,673 A | 9/1992 | Hoffa |
| 5,831,426 A | 11/1998 | Black, Jr. et al. |
| 6,501,285 B1 | 12/2002 | Hopkins et al. |
| 6,621,276 B2 | 9/2003 | Wen et al. |

(Continued)

FOREIGN PATENT DOCUMENTS

| | | |
|---|---|---|
| JP | 02133016 A | 5/1990 |
| JP | 06253430 | 9/1994 |

(Continued)

OTHER PUBLICATIONS

International Search Report and Written Opinion of the International Searching Authority for International application No. PCT/CA2014/050770 dated Oct. 28, 2014.

(Continued)

*Primary Examiner* — Carl Arbes
(74) *Attorney, Agent, or Firm* — Carlson, Gaskey & Olds (57) ABSTRACT

An illustrative wire processing machine includes at least one blade configured for at least one of cutting a conductor or at least piercing an insulation layer on the conductor. At least one gripper assembly includes a gripper configured to at least temporarily grasp a portion of a conductor during a wire processing operation. A generator, which is part of the gripper assembly, is configured to radiate a field toward a conductor. The gripper assembly also includes a detector that is configured to detect at least some of the field propagated along the conductor. A processor is configured to determine when a change in the propagated field detected by the detector indicates contact between a conductor and the blade.

29 Claims, 7 Drawing Sheets

(56) References Cited

U.S. PATENT DOCUMENTS

| | | |
|---|---|---|
| 7,091,872 B1 | 8/2006 | Bigelow et al. |
| 7,587,918 B2 | 9/2009 | Imgrut |
| 7,622,931 B2 | 11/2009 | Wu et al. |
| 7,969,137 B2 | 6/2011 | Royle |
| 2007/0121796 A1 | 5/2007 | Lurati et al. |
| 2010/0077899 A1 | 4/2010 | Yano et al. |
| 2011/0101976 A1 | 5/2011 | Artinger |
| 2011/0246095 A1 | 10/2011 | Lim |
| 2012/0314226 A1 | 12/2012 | Kelly |
| 2013/0125710 A1* | 5/2013 | Hombu ................ H01R 43/28 81/9.51 |
| 2014/0033874 A1* | 2/2014 | Nakamura ........... H02G 1/1256 81/9.4 |
| 2014/0033875 A1* | 2/2014 | Nakamura ............... H02G 1/12 81/9.4 |
| 2015/0048842 A1 | 2/2015 | Ngo et al. |

FOREIGN PATENT DOCUMENTS

| | | |
|---|---|---|
| JP | 7-87643 | 3/1995 |
| JP | 07227022 A | 8/1995 |
| JP | 2013019710 A | 1/2013 |

OTHER PUBLICATIONS

International Search Report and Written Opinion of the International Searching Authority for International application No. PCT/CA2016/050014 dated Mar. 14, 2016.

* cited by examiner

WIRE PROCESSING MACHINE INCLUDING A CONDUCTOR MONITOR DEVICE

CROSS-REFERENCE TO RELATED APPLICATION

This application is a continuation-in-part to U.S. patent application Ser. No. 13/969,758 filed Aug. 19, 2013.

BACKGROUND

Electrical conductors are used in a variety of situations, such as in vehicle systems, for providing power to electrically powered components and communicating information among components. Most automated assembly techniques that involve electrical conductors include cutting the wires to a desired length and stripping insulation from the ends of the wire. The exposed wire ends are eventually connected in a manner that facilitates the desired power or communication connections.

One of the difficulties associated with wire processing equipment is that it may not be possible to avoid improperly cut or otherwise damaged wires. For example, the insulation stripping blades may penetrate too deeply through the insulation and contact the wire. It is also possible that the wire is not centered within the insulation at the location where the stripping blades contact the insulation and the blades also contact the wire. It is also possible, for example, that the segment of wire that is introduced to the stripping device has a configuration that results in an unexpected alignment between the stripping blades and the wire so that the stripping blades contact the wire when the insulation is cut and stripped from the wire end. Contact between an insulation stripping blade and a wire during the stripping operation typically results in an undesirably cut or damaged wire. If the integrity of a wire end is compromised the eventual connection that is supposed to be made through that wire may be faulty.

Detecting damage to the wires during the stripping process has proven difficult for several reasons. For example machine throughput may be at a very high rate which requires a very fast response from a detection device and reliable detection may not be achievable without slowing down the wire processing machine. Additionally, the way in which wires are manipulated during the cutting and stripping process makes it difficult or impractical to attempt to establish an electrically conductive physical connection with the wire for monitoring purposes.

One attempt at detecting when a wire may have been damaged while insulation was stripped from the wire is described in the United States Published Patent Application No. US2013/0125710. That document suggests using a wired connection between the stripping blades and a control board and measuring an impedance of the stripping blades. If there is contact between the stripping blades and the conductive wire, the impedance of the conductive wire is effectively added to that of the stripping blades. The increased impedance is described as being detectable for purposes of identifying when the stripping blades contact the wire. One drawback associated with that approach is that it requires a specially designed stripping device or modification of a stripping device to include the electrically conductive connection between the stripping blades and the control board.

With the increasing amount of technology being included in vehicles, for example, there is an increasing need for wiring and more reliable connections. Current trends also include a desire to reduce the size (i.e., diameter) of the wires. It is becoming increasingly important to ensure that damaged or improperly cut wires are identified to avoid faulty or unreliable connections.

SUMMARY

An illustrative example wire processing machine includes at least one blade configured for at least one of cutting a conductor or at least piercing an insulation layer on the conductor. At least one gripper assembly includes a gripper configured to at least temporarily grasp a portion of a conductor during a wire processing operation. A generator, which is part of the gripper assembly, is configured to radiate a field toward a conductor. The gripper assembly also includes a detector that is configured to detect at least some of the field propagated along the conductor. A processor is configured to determine when a change in the propagated field detected by the detector indicates contact between a conductor and the blade.

An illustrative example conductor monitor device includes a generator electrode configured to radiate an electrical near field toward a conductor. A detector is configured to detect at least some of the field propagated along the conductor. A processor is configured to determine whether there is a change in the propagated field detected by the detector. The electrical near field has a frequency and a transmission wavelength. The detector has a dimension that is smaller than the transmission wavelength. The electrical near field has effectively no magnetic field component in a vicinity of the detector based on a relationship between the detector dimension and the transmission wavelength.

The various features and advantages of disclosed examples will become apparent to those skilled in the art from the following detailed description. The drawings that accompany the description can be briefly described as follows.

DETAILED DESCRIPTION

Figure 1:
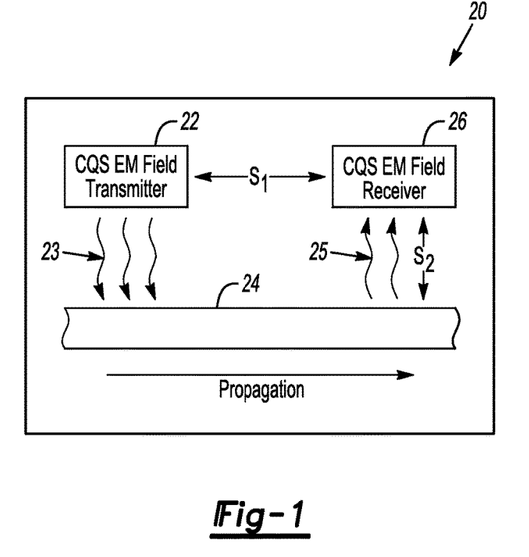
FIG. 1 schematically illustrates a conductor monitoring device designed according to an embodiment of this invention.

An example conductor monitoring device 20 is schematically shown in FIG. 1. A generator or transmitter 22 is configured to radiate a field schematically shown at 23 toward a conductor 24. The generator or transmitter 22 comprises at least one electrode in this example.

A detector or receiver 26 is configured to detect at least a portion of a field schematically shown at 25 that results from a signal induced in the conductor 24 that is propagated along the conductor 24. The induced signal in the conductor 24 results from the radiated field 23. In at least one sense, the conductor 24 acts like an antenna that radiates the field schematically shown at 25 in a manner that it can be detected by the detector 26.

The detector or receiver 26 comprises at least one electrode that is situated relative to the conductor 24 and the generator 22 so that the detector 26 will detect the field schematically shown at 25 instead of directly detecting the field 23 that is radiated from the generator 22. In FIG. 1, a spatial arrangement as schematically represented by the larger distance or spacing $S_1$ between the generator 22 and the detector 26 compared to a smaller distance or spacing $S_2$ between the detector 26 and the conductor 24 facilitates the detector 26 receiving or detecting the field 25 instead of the field 23. Given this description, those skilled in the art will realize how to arrange the generator 22 and detector 26 in a manner that facilitates the detector 26 detecting at least some of the field 25 that radiates from the conductor 24.

In at least one example, the field 23 effectively comprises an electric field without a magnetic component. Such an electric field is referred to as an electrical near field in this description. Radiating the field 23 toward the conductor 24 indirectly or remotely injects electrical energy into the conductor 24. The electric field 23 effectively induces current or a signal that is propagated along the conductor 24. In the illustrated examples, no electrically conductive, physical connection between the generator 22 and the conductor 24 is required. Detection is also indirect or remote because no electrically conductive, physical connection between the detector 26 and the conductor 24 is required.

Using indirect or remote signal injection allows for monitoring the quality of a conductor during a wire handling or processing operation without requiring any physical, electrically conductive connection for introducing an electrical signal onto the conductor 24. Additionally, using indirect or remote generation and detection allows for the monitoring device 20 to be more readily incorporated into a variety of wire processing machines. The generator 22 and detector 26 do not require any modification to an existing wire processing machine although some embodiments may have specially designed components for supporting or incorporating the generator 22 and detector 26. The generator 22 and detector 26 can be incorporated into a machine design or be configured as separate or distinct device that can be used in conjunction with a wire processing machine.

In at least one example, the generator 22 uses very low frequency range radiation, such as an electric field having a wavelength that is less than 100 kHz. In some examples, a frequency range between about 40 kHz and about 70 kHz is used. One feature of that frequency range is that its corresponding wavelength is within a range of a length of a spool of wire used with wire processing machinery (e.g., thousands of meters). When there is correspondence between the wavelength and the wire length, the spool of wire may serve as a form of a half wave dipole antenna or a quarter wave monopole antenna, which may boost the signal of the detector 26.

Another feature of the frequency range between 40 kHz and 70 kHz is that the corresponding wavelength is on the order of about 4 kilometers to about 8 kilometers (or 4,000,000 mm to 8,000,00 0mm) When an electrode on the order of about 20 mm in length is used as the generator 22 or detector 26, the transmitted wavelength ($\lambda$Tx) is much larger than the length of the electrode. In some embodiments, a ratio of the detector dimension to the transmission wavelength is less than about 0.000005.

According to the Maxwell-Faraday equation $\nabla \times E = -\delta B/\delta t$ a time-varying magnetic field is always accompanied by a spatially-varying, non-conservative electric field and vice versa. Also, when there is no spatially-varying electric field, there is no magnetic field present. With a large enough wavelength-to-electrode dimension ratio, the magnetic component of the radiated field is effectively zero and there is no wave propagation. The result using an example embodiment of this invention, which includes a sufficiently long wavelength and a sufficiently small electrode, is a quasi-static electric field that can be used for sensing conductive objects such as wire. In such an embodiment there is effectively no varying electrical field and no magnetic field propagation within the small electrode space.

Accordingly, some example embodiments of this invention utilize an electrical near field. When a conductor is shorted to ground, the electrical near field collapses accordingly.

Such a frequency range (i.e., 40-70 kHz) also allows for incorporating conductor quality monitoring without introducing any concern for adversely affecting a machine operator. Additionally, such low frequency radiation is much less likely to cause any interference with the operation of the wire processing machine or other devices in the vicinity of that machine. Additionally, using a wavelength range on the order of about 40 kHz to about 70 kHz is below the AM radio wave spectrum so that there is no concern with regulation compliance, such as that required by the United States Federal Communication Commission for higher frequencies.

Figure 2:
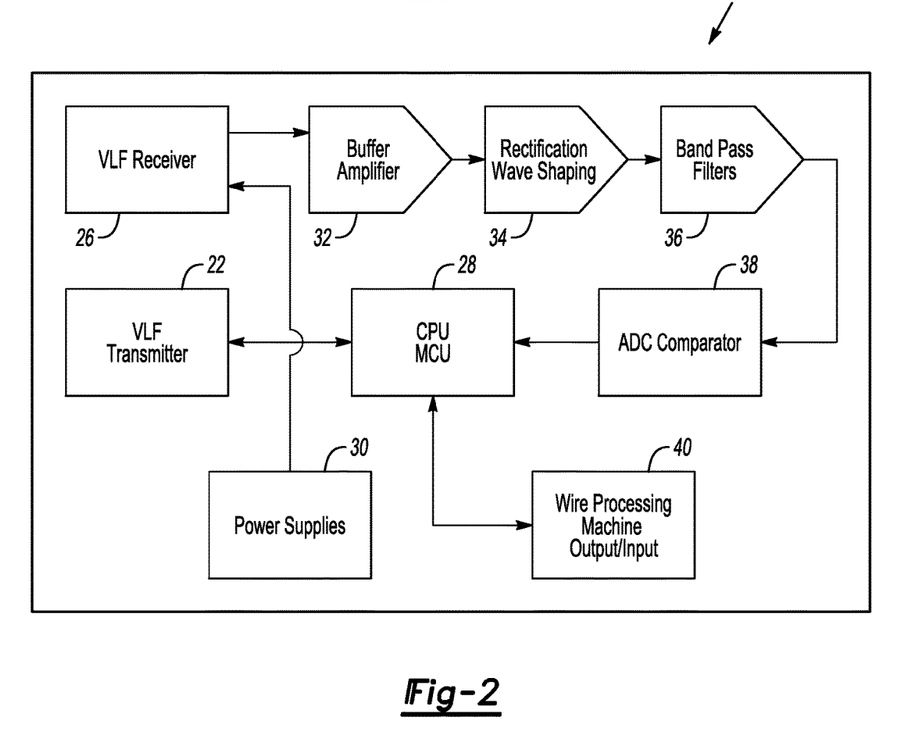
FIG. 2 schematically illustrates additional features of an example embodiment of a conductor monitoring device.

FIG. 2 schematically illustrates additional selected details of an example conductor monitoring device 20. In this example, a processor 28 communicates with the generator 22 and the detector 26. The processor 28 is configured to determine when a change in the propagated field 25 detected by the detector 26 indicates contact between the conductor 24 and a conductive blade of a wire processing machine.

In the example of FIG. 2, a power supply 30 provides power to the generator 22, detector 26 and processor 28. As the detector 26 detects a signal or field radiated from the conductor 24, it generates an output that is provided to a buffer amplifier 32 to increase the power or amplitude of a detected signal. A rectifier 34 facilitates shaping the waveform of the detected signal amplified by the amplifier 32. At least one band pass filter 36 filters out noise, for example, from the signal before it is provided to a comparator 38. In this example, the processor 28 receives information from the comparator 38 that indicates a state of the signal or field detected by the detector 26.

The example of FIG. 2 includes an output 40, such as a visual display, to communicate information regarding the quality of a conductor that has been cut, for example, and otherwise handled according to a desired wire handling operation. The processor 28 controls the display or output 40 in one of a variety of manners, one of which is described below. In some examples, the output 40 comprises an interface for communications between the processor 28 and a wire handling machine. This allows for the processor 28, for example, to obtain information regarding a particular stage of the wire processing operation so that the processor 28 can associate information regarding that which is detected by the detector 26 and a portion of a wire processing operation to provide a meaningful output.

Figure 3:
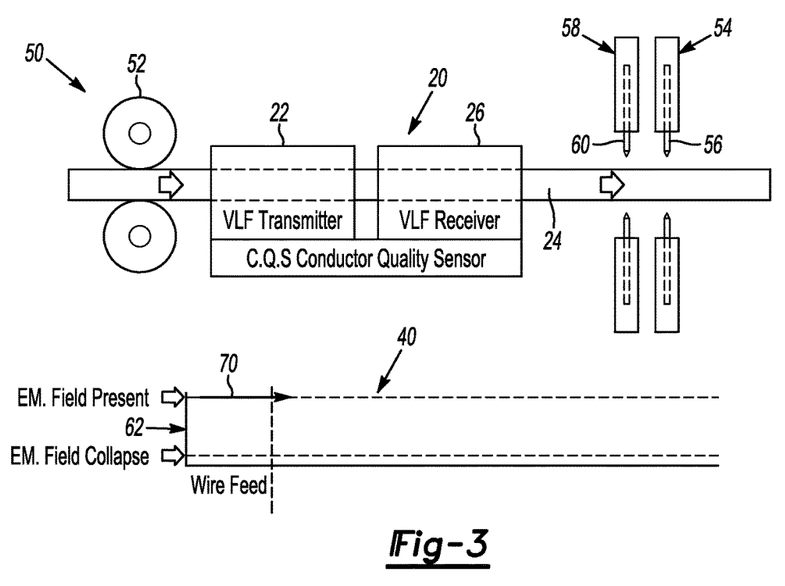
FIG. 3 schematically illustrates selected portions of a wire processing machine and a conductor monitoring device designed according to an embodiment of this invention during one stage of a wire processing operation.

FIG. 3 schematically illustrates selected portions of a wire processing machine 50 including a wire feed device 52 that feeds the conductor 24 along appropriate portions of the machine 50 to carry out a desired wire processing operation. A wire processing operation that involves cutting the conductor 24 to a desired length and stripping insulation from at least one cut end of the wire is considered for discussion purposes.

As shown in FIG. 3, the machine 50 includes a cutting device 54 that includes at least one electrically conductive cutting blade 56. A stripping portion 58 includes at least one electrically conductive stripping blade 60 that is configured to strip insulation from the exterior of the conductor 24. The output 40 in FIG. 3 includes a DC wave form plot 62. A DC wave form includes a first, positive value shown at 70 during the portion of the wire processing operation schematically shown in FIG. 3. As the conductor 24 is being fed along the machine toward the cutting portion 54, the generator 22 is inducing an electrical signal that is propagated along the conductor 24 and detected by the detector 26. The resulting output shown at 70 represents the determination made by the processor 28 regarding a value or characteristic of that which is detected by the detector 26, such as a positive field 25 radiated from the conductor 24.

Figure 4:
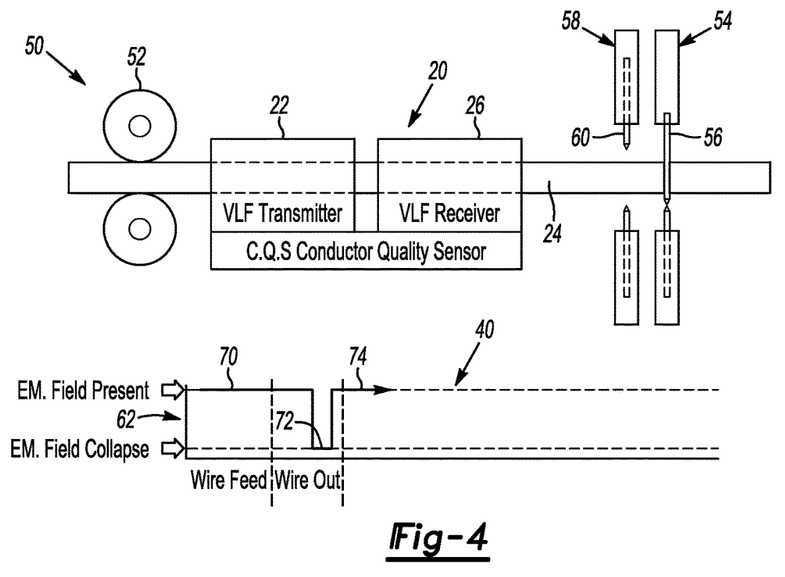
FIG. 4 illustrates the arrangement of FIG. 3 during another stage of the wire processing operation.

FIG. 4 schematically shows another stage of the wire processing operation. In FIG. 4, the cutting blade 56 moves into contact with and cuts through the conductor 24. The cutting blade 56 is electrically conductive. Contact between the cutting blade 56 and the conductive wires of the conductor 24 effectively results in grounding the signal that is propagated along the conductor 24, which results from the field generated by the generator 22.

Contact between the cutting blade 56 and the conductive wires of the conductor 24 is represented in the output 40 when the DC signal value drops as is shown at 72. After the cutting blade 56 is retracted and no longer in contact with the conductive wires of the conductor 24, the DC signal returns to a positive value shown at 74.

In embodiments where the processor 28 is provided with information regarding the stage of operation being accomplished by the machine 50, the processor 28 may provide an indication that the signal change at 72 corresponds to a desired cutting of the wire accomplished by the cutting blade 56.

Figure 5:
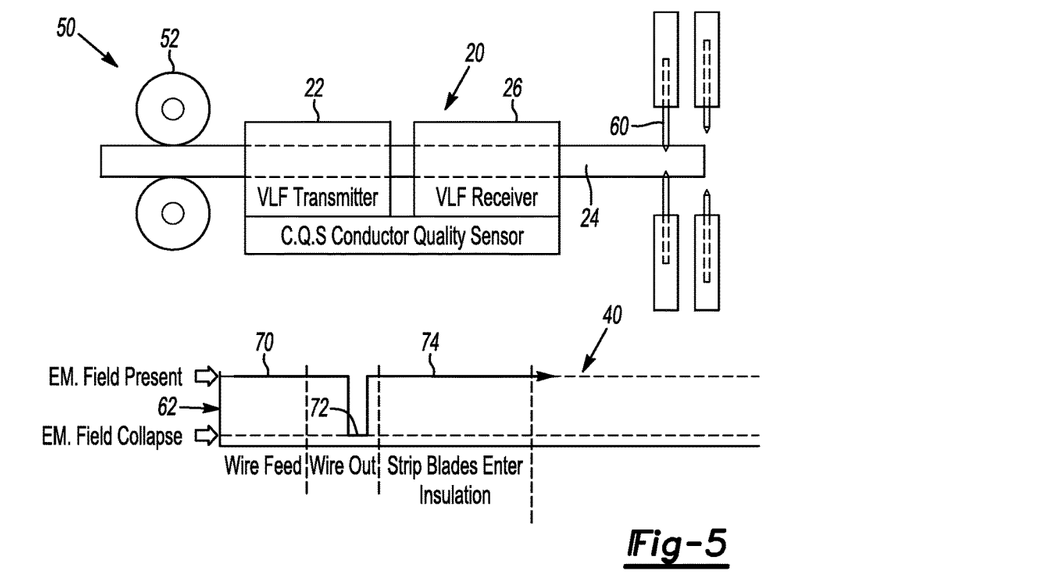
FIG. 5 illustrates the arrangement of FIGS. 3 and 4 during another stage of the wire processing operation.

FIG. 5 schematically illustrates a subsequent stage of the example wire processing operation. At this stage, the stripping blade 60 moves into contact with at least an exterior of the conductor 24. Provided that the stripping blade 60, which is electrically conductive, does not make contact with any of the conductive wires of the conductor 24, the signal value or amplitude remains essentially constant and positive as shown at 74 in the output 40 of FIG. 5.

Figure 6:
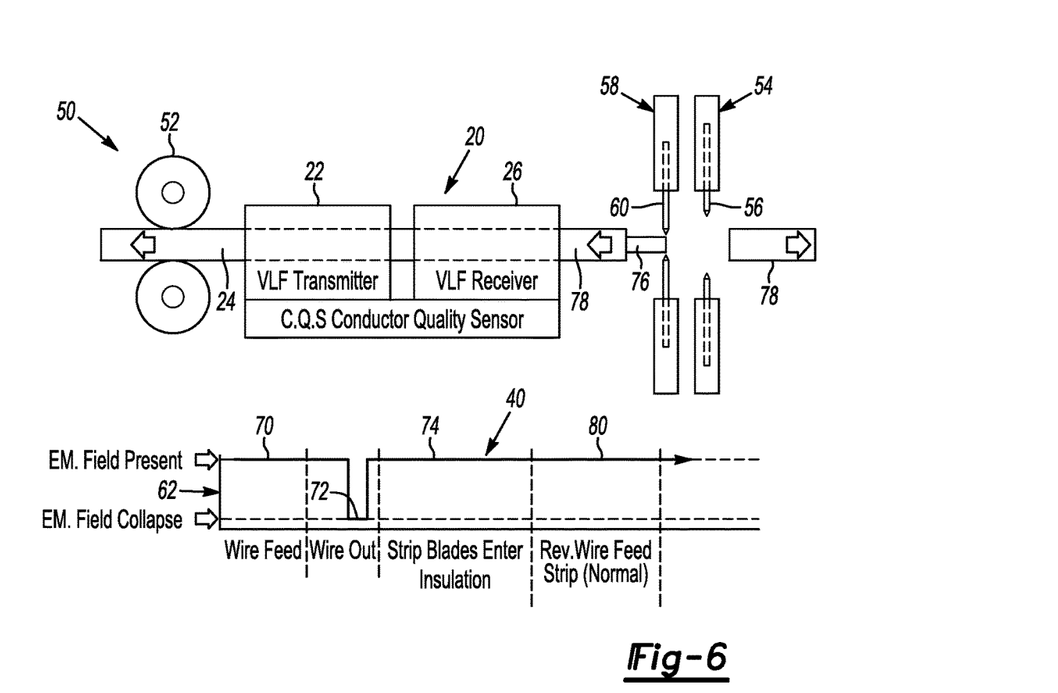
FIG. 6 illustrates the arrangement of FIGS. 3-5 during another stage of the wire processing operation.

FIG. 6 shows a later stage of the wire processing operation after the stripping blade 60 has cut through an insulation layer 78 and the conductor 24 has been retracted by the wire feed device 52 (e.g., drawn or pulled to the left according to the drawing) so that conductive wires 76 are exposed at one end of the conductor where the cut was made. The removed plug of insulation shown at 78' may be disposed of in a known manner.

The output 40 in FIG. 6 includes a positive value of the DC signal representation at 80. Given that the DC signal remained at the same value from 74 to 80, there was no electrically conductive contact between the stripping blade 60 and the conductive wires 76.

Figure 7:
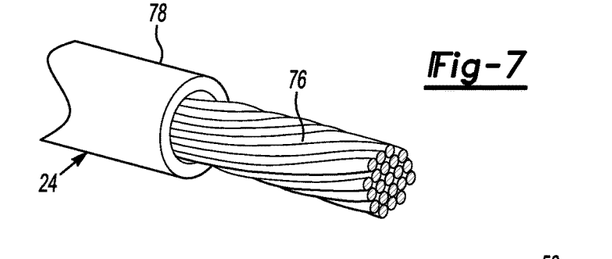
FIG. 7 diagrammatically illustrates a conductor that has been properly cut and had insulation stripped from the conductive wires, which would be an example result of the wire handling operation schematically shown in FIGS. 3-6.

FIG. 7 schematically illustrates an example conductor 24 that is considered acceptable because the wire cutting and stripping operation was successful. As shown in FIG. 7, a plurality of conductive wires 76 are exposed at the end of the conductor 24 and the insulation layer 78 covers another portion of the conductor. The exposed conductive wires 76 may then be used for establishing a desired type of connection, such as a crimp connection, for incorporating the conductor 24 into an assembly, such as a vehicle wire harness.

The output 40 in FIG. 6 represents a graphical illustration of a monitored wire cutting and insulation stripping operation that was accomplished in a manner that provides a desired condition of the resulting conductor. While a graphical illustration is shown as the example output 40, some embodiments of wire processing monitors designed according to this invention provide alternative forms of output such as written words or colors that provide an indication of a positive or negative result at various stages of the wire processing operation.

Figure 8:
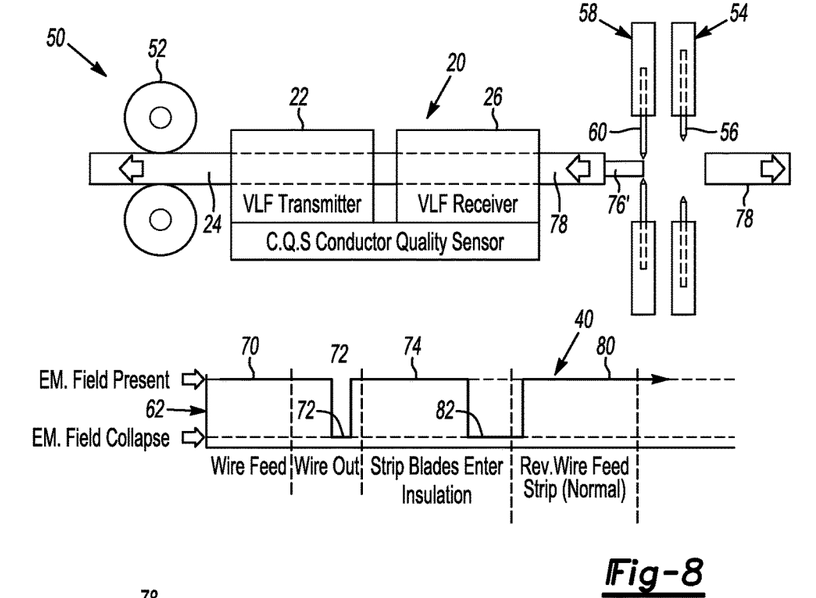
FIG. 8 schematically illustrates another condition during a stage of a wire handling operation in which conductive wires are contacted by a stripping blade during an insulation stripping portion of the operation.

FIG. 8 schematically illustrates a wire stripping stage of a wire processing operation in which the stripping blade 60 makes undesirable contact with at least one of the conductive wires 76 of the conductor 24. As shown in the output 40, the DC signal value drops at 82 before it returns to a positive value shown at 80. This grounding or reduction in the signal propagated along the conductor 24 is detected by the detector 26. The reduced signal value shown at 82 corresponds to the stripping blade 60 effectively grounding the signal or field propagated along the conductor 24 when there is contact between the electrically conductive stripping blade 60 and one or more of the conductive wires of the conductor 24. In FIG. 8, the resulting cut wire includes a damaged or improperly cut bundle of exposed wires 76' at one end of the cut conductor. The output 40 including the signal drop at 82 provides an indication that this wire should be rejected and not incorporated into a device or assembly that requires a properly cut and stripped wire.

Figures 9, 10:
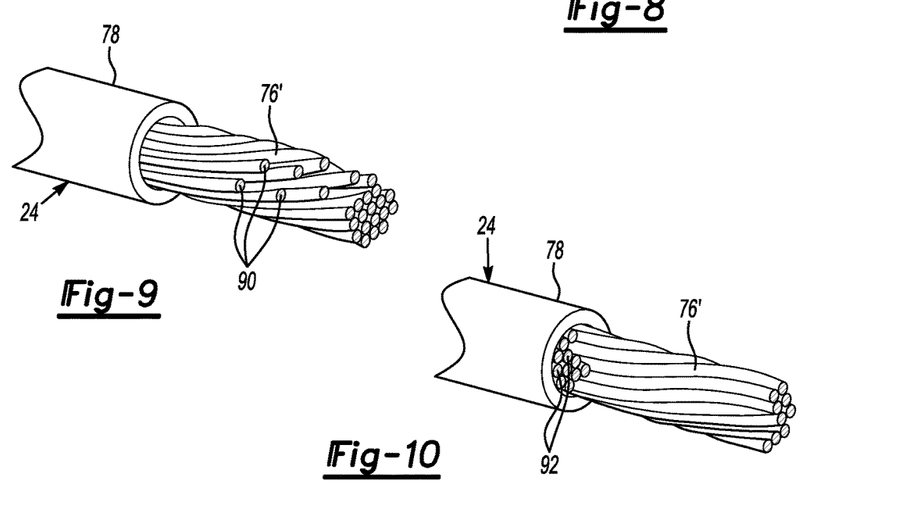
FIG. 9 schematically illustrates example damage to one or more conductive wires when there is undesired contact between a stripping blade and the conductive wires during an insulation stripping portion of a wire handling operation.
FIG. 10 diagrammatically illustrates an example improperly cut wire resulting from undesired contact between a stripping blade and the conductive wires during the insulation stripping portion of the wire handling operation.

The conductor quality monitor provides an ability to detect a variety of types of damage or alteration made to the conductor 24 during the wire processing operation. FIG. 9 schematically illustrates one example scenario in which a plurality of shorter or broken wire ends 90 are included among the exposed wires 76' resulting from contact between those individual wires and the stripping blade 60. FIG. 10 schematically illustrates an arrangement in which some of the wires 76' are cut short having ends at 92. The type of contact between the stripping blade 60 and the wires resulting in an arrangement as schematically shown in FIGS. 9 and 10 may be caused by a variety of circumstances. There may have been a malfunction in the operation of the stripping portion 58 of the machine 50, the conductor may have been presented to the stripping blade 60 in an unexpected position, or the conductive wires may not have been concentrically arranged uniformly within the insulation layer. These and other situations can be reliably detected using the conductor quality monitor device 20 of the illustrated example embodiment.

Figure 11:
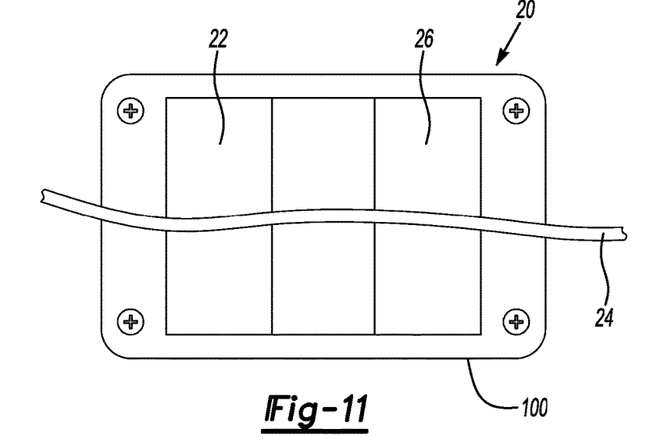
FIG. 11 diagrammatically illustrates selected features of an example embodiment of a conductor monitoring device designed according to this invention.

The configuration of the conductor quality monitor that includes a generator 22 and a detector 26 that allows for inducing and observing at least one electrical signal along a conductor without making contact with that conductor may take a variety of forms. FIG. 11 schematically illustrates an example embodiment in which a base or plate 100 supports an electrode that operates as the generator 22 and another electrode that operates as the detector 26. The electrodes may comprise flat plates or may have a U-shaped configuration, for example. A configuration such as that shown in FIG. 11 allows for the monitoring device 20 to be placed at a variety of positions relative to a wire processing machine.

Figure 12:
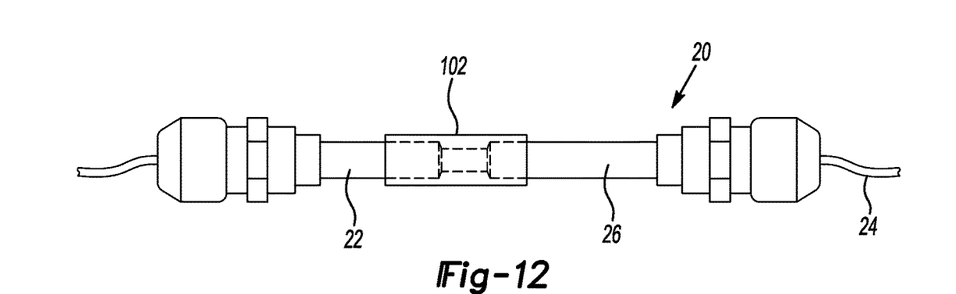
FIG. 12 diagrammatically illustrates another example embodiment of a conductor monitoring device.

FIG. 12 illustrates another example embodiment that includes a tubular configuration 102 through which the conductor 24 is passed during appropriate portions of the wire processing operation. In this example, a first cylindrical electrode serves as the generator 22 and the detector 26 comprises another cylindrical electrode. The conductor 24 is received within the tubes so that the signal or field detected by the detector 26 is induced in the conductor 24 by the generator 22 while the conductor 24 is within the tubes. There is no requirement for any electrically conductive, physical contact between any portion of the tubular configuration 102 and the conductor.

Figure 13:
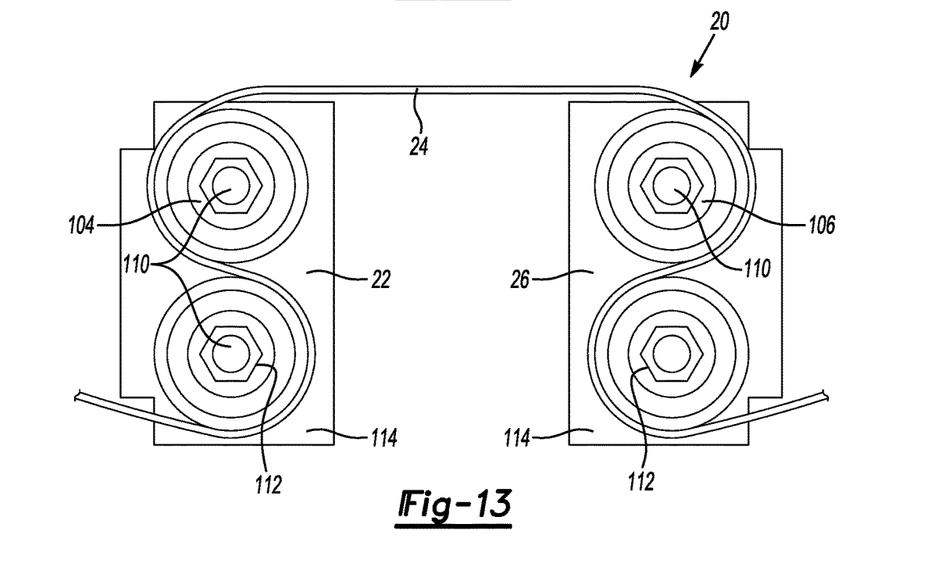
FIG. 13 diagrammatically illustrates another example embodiment of a conductor monitoring device.

FIG. 13 illustrates another example arrangement in which the conductor 24 is wound at least partially about a series of wheels or springs 104 and 106. The generator 22 in this example includes at least one electrode associated with the wheels 104 and the detector 106 includes at least one electrode associated with the wheels 106. Various portions of the illustrated example may be used as the electrodes for realizing the operation of the generator 22 and the detector 26, respectively. For example, metallic bearings (not illustrated), axels 110, fasteners 112 (e.g., nuts) or base plates 114 associated with the wheels or springs may operate as an electrode for purposes of realizing the function of the example generator 22 and detector 26, respectively.

Figure 14:
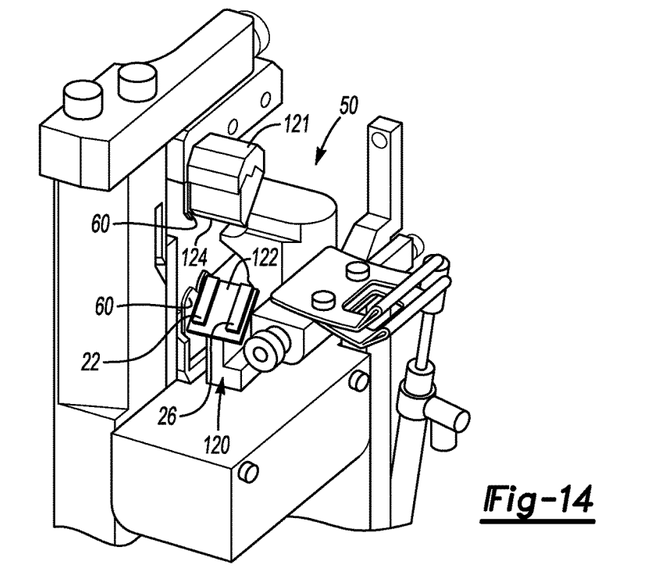
FIG. 14 diagrammatically illustrates an example embodiment of a wire processing machine.

FIG. 14 illustrates selected features of an example wire processing machine 50 that includes conductor quality monitoring capabilities. A gripper assembly 120 includes at least one gripper 121 having gripper surfaces 122 and 124 shown spaced apart from each other. During a wire processing procedure at least the gripper surface 124 moves relative to the surface 122 to close the gripper 121 onto a wire to a least temporarily grasp the wire between the surfaces 122 and 124. In this example, the gripper assembly 120 supports blades 60 that are situated for piercing through and cutting insulation surrounding a conductor so that the insulation can be removed leaving an exposed portion of the conductor at an end of the wire.

In this example, the gripper assembly 120 includes a generator electrode 22. In this particular embodiment the generator electrode 22 is supported on the gripper surface 122. The generator electrode 22 generates an electrical near field that is injected into the conductor while the wire is grasped by the gripper 121. The gripper assembly also includes a detector electrode 26, which is supported on the surface 122 in this embodiment. The detector electrode 26 detects a field propagated along the conductor. The detector 26 and the generator 22 of this example operate consistent with the explanation provided above regarding generators and detectors.

One of the features of the embodiment of FIG. 14 is that the conductor quality monitoring components, such as the generator and detector electrodes are part of the gripper assembly 120. This approach incorporates the conductor quality monitoring features into the wire processing machine 50 in a manner that does not require altering the configuration or operation of the machine and avoids any need to accommodate separate or standalone conductor quality monitoring sensors. The strategic placement of the generator electrode 22 and the detector electrode 26 also places conductor quality monitoring components at the location where the blades 60 will encounter the wire and possibly the conductor.

In the example embodiment of FIG. 14, the generator electrode 22 and the detector electrode comprise generally flat strips of electrically conductive material. Wired connections between a processor and those electrodes may be made in a manner that does not interfere with or otherwise complicate the movement or operation of other parts of the machine 50. Such wired connections may be useful for providing power to either electrode and communicating signals to the processor, for example.

Figure 15A:
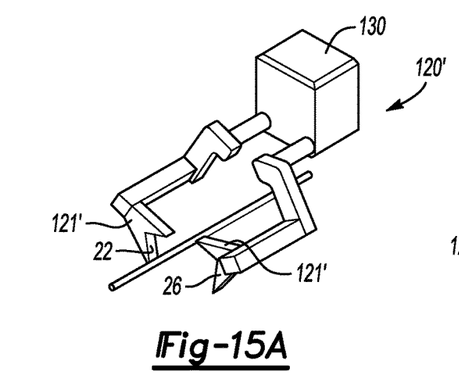
FIGS. 15a and 15b diagrammatically illustrate an example gripper mechanism embodiment.
Figure 15B:
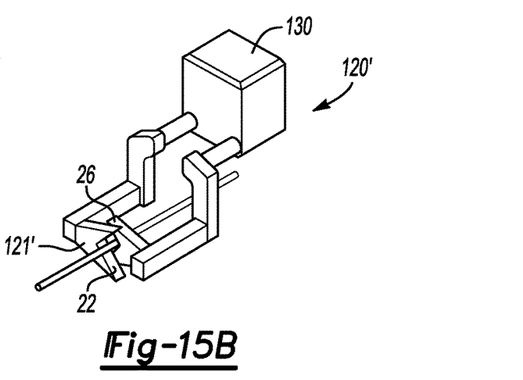

FIGS. 15a and 15b illustrate another example embodiment. The gripper assembly 120' is shown with a gripper 121' in an open position in FIG. 15a and in a closed or grasping position in FIG. 15b in which the gripper 121' of the gripper assembly 120' at least temporarily grasps (and possibly moves or manipulates) a wire. A mechanism 130 controls the position of the portions of the gripper 121' to realize the desired position (e.g., open or closed) of the gripper 121'. In this example, at least part of the gripper 121' operates as the generator electrode 22. This example includes gripper fingers or jaws that are situated to be on opposite sides of a wire. One of the fingers or jaws is labeled 22 in this example because it is configured to operate as the generator electrode 22. The electrical near field is radiated from a surface of the finger or jaw 22 facing toward the wire in this example. The other finger or jaw of the gripper 121' is labeled 26 because it is configured to operate as the detector electrode 26. This embodiment further reduces the number of individual pieces or components needed to perform desired wire processing operations and monitor the resulting quality of a conductor. For example, there is no requirement for any separate electrodes or additional electrode material added to the gripper assembly 120'. Instead, the gripper 121' itself operates as the generator and detector of the conductor monitoring portion of the machine.

Figure 16A:
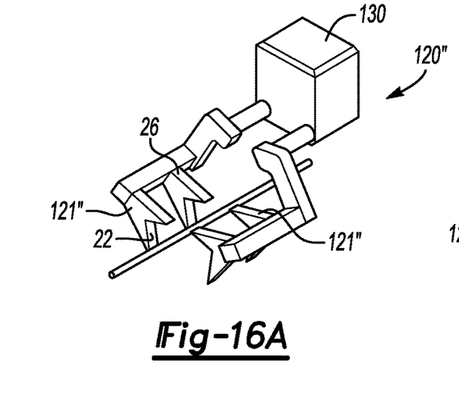
FIGS. 16a and 16b diagrammatically illustrate another example gripper mechanism embodiment.
Figure 16B:
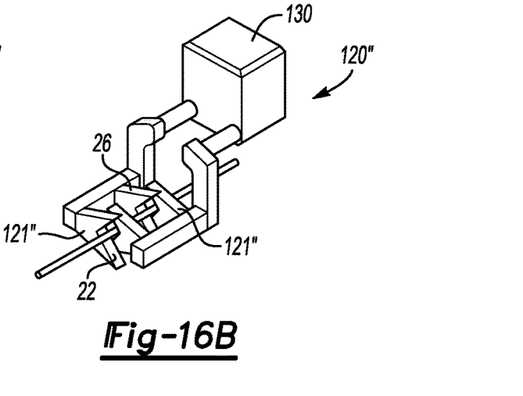

FIGS. 16a and 16b show another example embodiment of a gripper assembly 120". This example includes two grippers 121" that selectively grasp at least one wire. At least one of the fingers or jaws of one of the grippers 121" is configured to operate as the generator 22 of the conductor quality monitor for injecting an electrical near field into a conductor of a wire. At least one of the gripper fingers or jaws of the other gripper 121" operates as the detector 26.

Other embodiments include gripper assemblies arranged similar to the arrangements of FIGS. 15 and 16 including electrodes situated on one or more surfaces of the gripper fingers or jaws in a similar manner in which the electrodes are supported on a gripping surface as shown in FIG. 14. The examples of FIGS. 14-16 demonstrate several ways to integrate conductor monitoring sensor components into a gripper assembly of a wire processing machine, such as by securing a detector or generator electrode on a gripper component or by using a gripper component, itself, as the detector or generator.

One feature of using a gripper component as a detector or generator electrode or supporting an electrode on a gripper component is that the electrical near field is directed toward the conductor while reducing or eliminating movement of the conductor relative to the electrode. The gripper component provides stability to the conductor which reduces or eliminates vibratory or repeated movement of the conductor within the electric field. Reducing such movement may facilitate more accurate measurement and detection of blade contact with the conductor.

In some embodiments the processor 28 is programmed to recognize when there is undesired contact between a blade and a conductor. The processor 28 provides information regarding such conditions to a machine controller in a format that the machine controller recognizes as requiring a change in machine operation, such as altering the position (or advancement) of one or more cutting blades to avoid such undesired contact. In some embodiments, the processor 28 provides real time feedback to the machine controller to allow for adjustment to the wire processing machine operation on a continuous or periodic basis depending on the needs of a particular situation. Those skilled in the art who have the benefit of this description will realize how to program or design a processor to accomplish such feedback to meet their particular needs.

Figure 17:
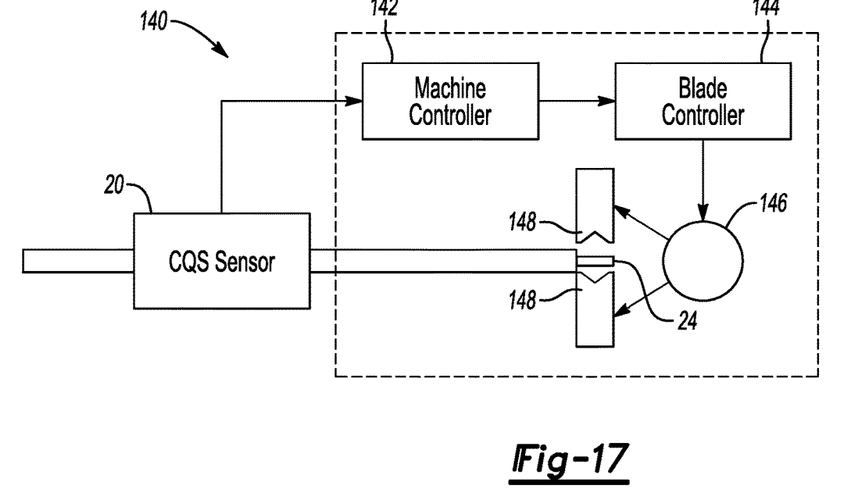
FIG. 17 schematically illustrates selected portions of an example embodiment of a wire processing machine.

FIG. 17 schematically illustrates selected portions of a wire processing machine 140 including a monitoring device 20, a machine controller 142, a blade controller 144, a motor 146 that causes movement of blades 148 to achieve a desired amount of cutting or insulation stripping so that the conductor 24 has desired characteristics. In this example, the monitoring device 20 provides information to the machine controller 142 regarding an amount of time that the blades 148 are in contact with the conductor 24 and other conductors processed by the machine 140. Such information is useful for the machine controller 142 to communicate with the blade controller 144 to cause an adjustment in blade position.

Figure 18:
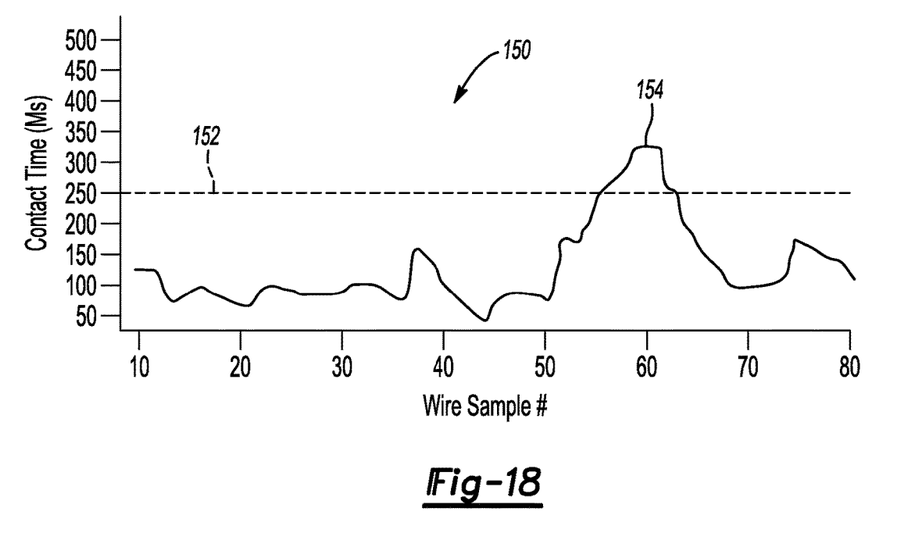
FIG. 18 graphically illustrates a control feature of the embodiment of FIG. 17.

FIG. 18 illustrates one example technique of using such contact time information. In this example, a threshold contact time, such as 250 milliseconds, is set as an indicator when there is an undesired amount of contact between the blades 148 and a conductor 24. The graph 150 shows the amount of time there is contact between the blades 148 and a conductor 24 for a series of wires processed by the machine 140. As can be appreciated from the drawing, the contact time is below the threshold 152 through the first fifty wires that are processed. Between the fiftieth and sixtieth wires, the contact time exceeds the threshold as shown at 154. The machine controller interprets that information as a need to open the blades 148, to adjust an amount of movement of the blades, or both. Given that information, the controller 142 determines an adjustment and communicates that to the blade controller 144. Depending on whether the contact time remains above the threshold or returns to an acceptable level, the controller 142 may determine how to make further adjustments to the blade position. As shown in FIG. 18, the contact time returns to acceptable levels for at least the next forty wires so no further adjustment was needed.

The control features illustrated through FIGS. 17 and 18 allow for the monitoring device to enhance the machine operation as the controller 142 may adjust to differences in wires in a dynamic fashion. For example, when a portion of a lot of wire processed by the machine varies from other portions of the lot (e.g., a variation in conductor diameter) undesired contact with the conductors may be avoided based on automated adjustments to the machine operation in real time. The monitoring device 20 provides real time feedback regarding machine operation in such an embodiment.

Several different embodiments are illustrated and described above. The various features of those embodiments may be combined in ways not necessarily described or illustrated. In other words, the features of any one disclosed embodiment may be combined with one or more features of any of the other disclosed embodiments. Those skilled in the art who have the benefit of this description will realize what configuration of the example features consistent with the preceding description will best suit their particular needs.

The disclosed example conductor quality monitor devices, wire processing machine components, and grippers allow for efficiently and reliably detecting when a wire is damaged or potentially damaged during a wire processing operation, such as one that involves cutting a wire and stripping insulation from it. The contactless monitoring device includes the feature of not requiring any physical, electrically conductive connection with the conductor, itself, but instead uses a remotely induced signal or field (i.e., without a direct, electrically conductive, physical connection) propagated along the conductor and remote detection of that signal or field. Additionally, the example devices described above can be utilized with a variety of wire processing machines without requiring any modification to those machines.

The preceding description is illustrative rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A wire processing machine, comprising:
   at least one blade configured for at least one of cutting a conductor or at least piercing an insulation layer on the conductor;
   at least one gripper assembly including:
      a generator that is configured to radiate a field toward the conductor,
      a detector that is configured to detect at least some of the field propagated along the conductor, and
      at least one gripper configured to at least temporarily grasp a portion of a wire including the conductor during a wire processing operation, the at least one gripper operating as at least one of the generator and the detector; and
   a processor configured to determine when a decrease in the field propagated along the conductor and detected by the detector indicates contact between the conductor and the blade.

2. The wire processing machine of claim 1, wherein
the generator comprises a generally flat electrode supported on a portion of the at least one gripper; and
the detector comprises a generally flat electrode supported on a portion of the at least one gripper.

3. The wire processing machine of claim 2, wherein
the generator comprises a flat strip of conductive material; and
the detector comprises a flat strip of conductive material.

4. The wire processing machine of claim 3, wherein
the gripper includes a surface that a conductor is received against when the gripper is grasping the conductor; and
the generator and the detector are supported on the surface.

5. The wire processing machine of claim 1, wherein
the generator radiates the field into a conductor while the gripper grasps the conductor; and
the detector detects the field propagated along the conductor while the gripper grasps the conductor.

6. The wire processing machine of claim 1, wherein the at least one cutting blade is connected to at least one portion of the gripper assembly.

7. The wire processing machine of claim 1, wherein
the machine includes a base;
the at least one gripper includes a first portion and a second portion;
the first portion remains stationary relative to the base;
the second portion is moveable relative to the base and the first portion; and
the generator and the detector are supported on the first portion.

8. The wire processing machine of claim 1, wherein
the at least one blade comprises a cutting blade and a stripping blade;
the processor is configured to provide an output that is indicative of the propagated field detected by the detector;
the output is indicative of desired contact between the conductor and the cutting blade when the conductor is intentionally cut by the cutting blade; and
the output is indicative of undesired contact between the conductor and the stripping blade when the conductor is contacted by the stripping blade.

9. The wire processing machine of claim 8, wherein the output includes
a first portion indicating that the propagated field detected by the detector decreases or is grounded at a time corresponding to contact between the cutting blade and the conductor;
a second portion indicating that the propagated field detected by the detector decreases or is grounded at a time corresponding to contact between the stripping blade and the conductor; and
the first portion has a characteristic that is different than a corresponding characteristic of the second portion.

10. The wire processing machine of claim 1, wherein
the generator radiates the field into the conductor without contacting the conductor; and
the detector detects at least some of the field propagated along the conductor without contacting the conductor.

11. The wire processing machine of claim 1, wherein the field is an electrical near field.

12. The wire processing machine of claim 11, wherein
the electrical near field has a frequency and a transmission wavelength;
the detector has a dimension that is smaller than the transmission wavelength; and
a relationship between the detector dimension and the transmission wavelength is such that the electrical near field has effectively no magnetic field component in a vicinity of the detector.

13. The wire processing machine of claim 12, wherein a ratio of the detector dimension to the transmission wavelength is less than about 0.000005.

14. The wire processing machine of claim 1, wherein
the at least one gripper comprises a plurality of gripping components;
at least one of the gripping components operates as the generator; and
at least one other of the gripping components operates as the detector.

15. The wire processing machine of claim 14, wherein the plurality of gripping components comprise gripper jaws or gripper fingers.

16. The wire processing machine of claim 1, wherein
the at least one gripper comprises a first gripper and a second gripper;
a portion of the first gripper operates as the generator; and
a portion of the second gripper operates as the detector.

17. The wire processing machine of claim 1, wherein the decrease comprises the field being grounded by contact between the conductor and the blade.

18. A wire processing machine, comprising:
at least one blade configured for at least one of cutting a conductor or at least piercing an insulation layer on the conductor;
at least one gripper assembly including:
at least one gripper configured to at least temporarily grasp a portion of a wire including the conductor during a wire processing operation,
a generator that is configured to radiate a field toward the conductor, and
a detector that is configured to detect at least some of the field propagated along the conductor; and
a processor configured to determine when a change in the propagated field detected by the detector indicates contact between the conductor and the blade,
wherein
the at least one blade comprises a cutting blade and a stripping blade;
the processor is configured to provide an output that is indicative of the propagated field detected by the detector;
the output is indicative of desired contact between the conductor and the cutting blade when the conductor is intentionally cut by the cutting blade; and
the output is indicative of undesired contact between the conductor and the stripping blade when the conductor is contacted by the stripping blade.

19. The wire processing machine of claim 18, wherein
the at least one gripper comprises a first gripper and a second gripper;
the first gripper includes the generator; and
the second gripper includes the detector.

20. The wire processing machine of claim 18, wherein the output includes
a first portion indicating that the propagated field detected by the detector decreases or is grounded at a time corresponding to contact between the cutting blade and the conductor;
a second portion indicating that the propagated field detected by the detector decreases or is grounded at a time corresponding to contact between the stripping blade and the conductor; and the first portion has a characteristic that is different than a corresponding characteristic of the second portion.

21. The wire processing machine of claim 20, wherein the processor determines that the change in the propagated field detected by the detector indicates contact between the conductor and the blade when the field propagated along the conductor decreases.

22. The wire processing machine of claim 21, wherein the processor determines that the change in the propagated field detected by the detector indicates contact between the conductor and the blade when the field propagated along the conductor is grounded.

23. The wire processing machine of claim 18, wherein
the generator radiates the field into the conductor without contacting the conductor; and
the detector detects at least some of the field propagated along the conductor without contacting the conductor.

24. The wire processing machine of claim 18, wherein
the field is an electrical near field that has a frequency and a transmission wavelength;
the detector has a dimension that is smaller than the transmission wavelength; and
a relationship between the detector dimension and the transmission wavelength is such that the electrical near field has effectively no magnetic field component in a vicinity of the detector.

25. The wire processing machine of claim 24, wherein a ratio of the detector dimension to the transmission wavelength is less than about 0.000005.

26. A wire processing machine, comprising:
at least one blade configured for at least one of cutting a conductor or at least piercing an insulation layer on the conductor;
at least one gripper assembly including:
at least one gripper configured to at least temporarily grasp a portion of a wire including the conductor during a wire processing operation,
a generator that is configured to radiate a field toward the conductor, and
a detector that is configured to detect at least some of the field propagated along the conductor; and
a processor configured to determine when a change in the propagated field detected by the detector indicates contact between the conductor and the blade,
wherein
the electrical field is a near field that has a frequency and a transmission wavelength;
the detector has a dimension that is smaller than the transmission wavelength; and
a relationship between the detector dimension and the transmission wavelength is such that the electrical near field has effectively no magnetic field component in a vicinity of the detector and a ratio of the detector dimension to the transmission wavelength is less than about 0.000005.

27. A wire processing machine, comprising:
at least one blade configured for at least one of cutting a conductor or at least piercing an insulation layer on the conductor;
at least one gripper assembly including:
at least one gripper configured to at least temporarily grasp a portion of a wire including the conductor during a wire processing operation,
a generator that is configured to radiate a field toward the conductor, the generator comprising a generally flat electrode supported on a portion of the at least one gripper, and
a detector that is configured to detect at least some of the field propagated along the conductor, the detector comprising a generally flat electrode supported on a portion of the at least one gripper; and
a processor configured to determine when a decrease in the field propagated along the conductor and detected by the detector indicates contact between the conductor and the blade.

28. The wire processing machine of claim 27, wherein
the generator comprises a flat strip of conductive material; and
the detector comprises a flat strip of conductive material.

29. The wire processing machine of claim 27, wherein
the gripper includes a surface that a conductor is received against when the gripper is grasping the conductor; and
the generator and the detector are supported on the surface.

* * * * *